US008009953B2

(12) United States Patent
Noda et al.

(10) Patent No.: US 8,009,953 B2
(45) Date of Patent: Aug. 30, 2011

(54) THREE-DIMENSIONAL PHOTONIC CRYSTAL AND ITS MANUFACTURING METHOD THEREOF

(75) Inventors: Susumu Noda, Kyoto (JP); Makoto Okano, Kyoto (JP); Masahiro Imada, Kyoto (JP); Shigeki Takahashi, Kyoto (JP)

(73) Assignee: Kyoto University, Kyoto (JP)

( * ) Notice: Subject to any disclaimer, the term of this patent is extended or adjusted under 35 U.S.C. 154(b) by 1012 days.

(21) Appl. No.: 11/885,546

(22) PCT Filed: Mar. 3, 2006

(86) PCT No.: PCT/JP2006/304093
§ 371 (c)(1),
(2), (4) Date: Sep. 21, 2007

(87) PCT Pub. No.: WO2006/095648
PCT Pub. Date: Sep. 14, 2006

(65) Prior Publication Data
US 2008/0131660 A1 Jun. 5, 2008

(30) Foreign Application Priority Data
Mar. 5, 2005 (JP) .................................. 2005-106729

(51) Int. Cl.
G02B 6/10 (2006.01)
(52) U.S. Cl. ........................................ 385/131; 438/692
(58) Field of Classification Search .................. 385/131
See application file for complete search history.

(56) References Cited

U.S. PATENT DOCUMENTS
5,335,240 A * 8/1994 Ho et al. .......................... 372/39
5,406,573 A * 4/1995 Ozbay et al. ................ 372/43.01
5,998,298 A * 12/1999 Fleming et al. ................ 438/692
(Continued)

FOREIGN PATENT DOCUMENTS
JP      A 59-50589        3/1984
(Continued)

OTHER PUBLICATIONS

Yablonovitch, E., et al. "Photonic Band Structure: The Face-Centered-Cubic Case Employing Nonspherical Atoms," *Physical Review Letters*, vol. 67, No. 17, pp. 2295-2298, Oct. 21, 1991.

(Continued)

*Primary Examiner* — Charlie Peng
*Assistant Examiner* — Peter Radkowski
(74) *Attorney, Agent, or Firm* — Oliff & Berridge, PLC

(57) ABSTRACT

An object of the present invention is to provide a three-dimensional photonic crystal which allows an internal formation of a defect structure with an arbitrary shape and size. Multiple holes extending to two different directions are formed obliquely to a base body surface in order to form a first crystal and a second crystal. Base body left between the holes are made to be rods. Moreover, a connection crystal layer is formed by a part of rods having a size different from that of the rods in the first crystal and the second crystal. The connection crystal layer is held between the first crystal and the second crystal and they are fused. In a three-dimensional photonic crystal thus obtained, the rod becomes a point defect. The shape and size of the point defect can be arbitrarily set in any directions within the connection crystal layer. The shape and size of the point defect can also be controlled by adjusting the thickness of the connection crystal layer.

11 Claims, 10 Drawing Sheets

U.S. PATENT DOCUMENTS

| | | | |
|---|---|---|---|
| 6,358,854 B1 * | 3/2002 | Fleming et al. | 438/692 |
| 6,521,136 B1 * | 2/2003 | Sfez et al. | 216/24 |
| 6,650,672 B2 * | 11/2003 | Kito et al. | 372/45.01 |
| 6,660,551 B1 * | 12/2003 | Pabla | 438/39 |
| 6,684,008 B2 * | 1/2004 | Young et al. | 385/31 |
| 6,941,046 B2 * | 9/2005 | Koike et al. | 385/44 |
| 6,993,235 B2 * | 1/2006 | Takagi et al. | 385/129 |
| 2002/0105000 A1 * | 8/2002 | Abe | 257/80 |
| 2004/0081388 A1 * | 4/2004 | Koyama | 385/16 |
| 2005/0207717 A1 * | 9/2005 | Takagi et al. | 385/129 |

FOREIGN PATENT DOCUMENTS

| | | |
|---|---|---|
| JP | A 2001-74955 | 3/2001 |
| JP | A 2002-189135 | 7/2002 |
| JP | A 2004-6567 | 1/2004 |

OTHER PUBLICATIONS

Ogawa, S., et al. "Control of Light Emission by 3D Photonic Crystals," *Science*, vol. 305, pp. 227-229, Jul. 9, 2004.

* cited by examiner

Fig. 5
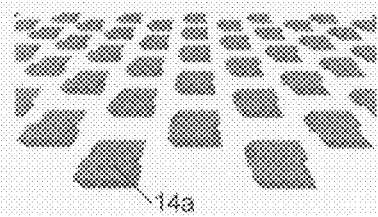
(a) Cross section A
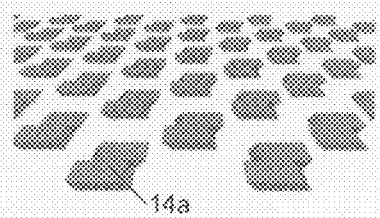
(b) Cross section B
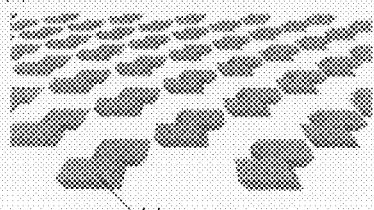
(c) Cross section C
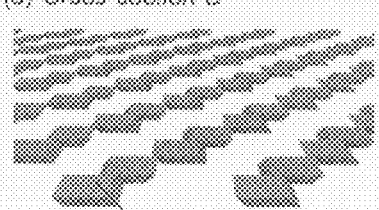
(d) Cross section D
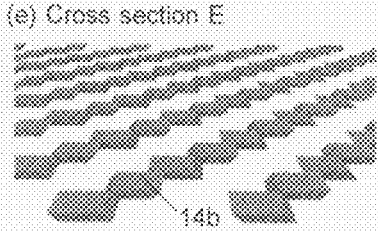
(e) Cross section E
Fig. 6
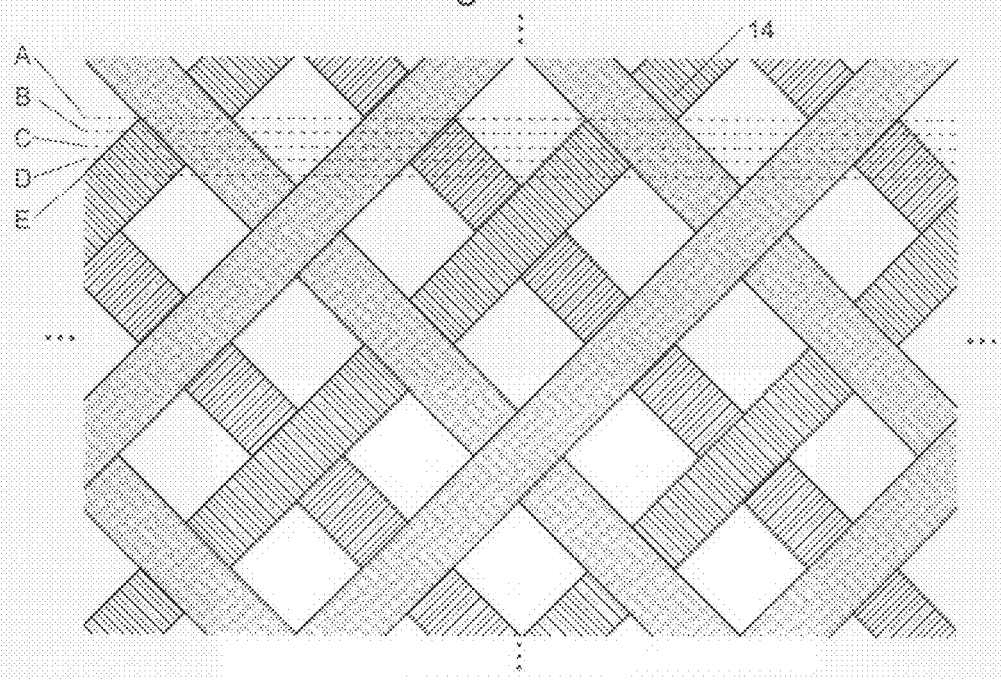

Fig. 7
(a) Cross section A
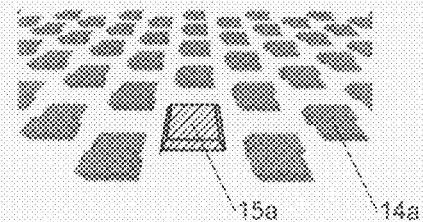
(b) Cross section E
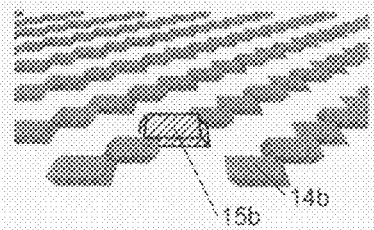
Fig. 8
(a) Cross section A
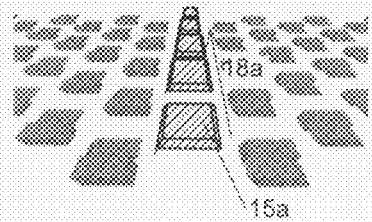
(b) Cross section A
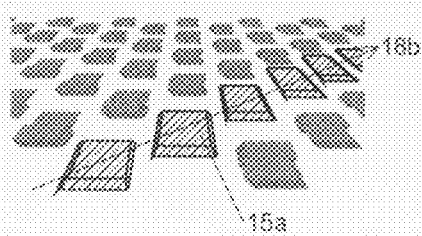
(c) Cross section E
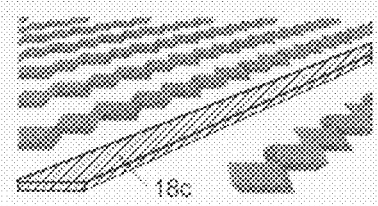
Fig. 9
(a) Cross section A
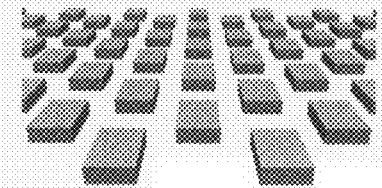
(b) Cross section C
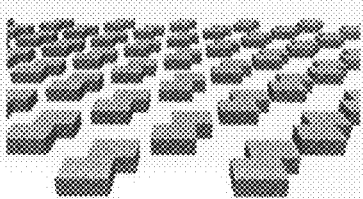
(c) Cross section E
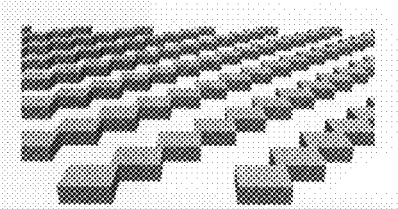
(d) Cross section E
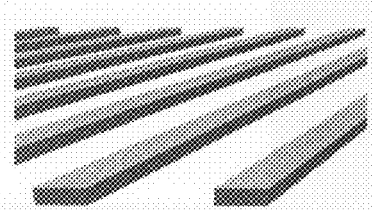

Fig. 16
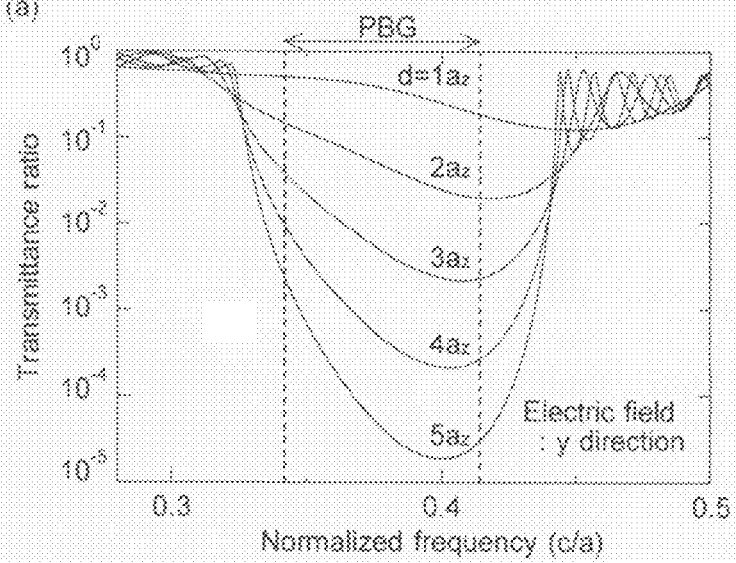
(a)
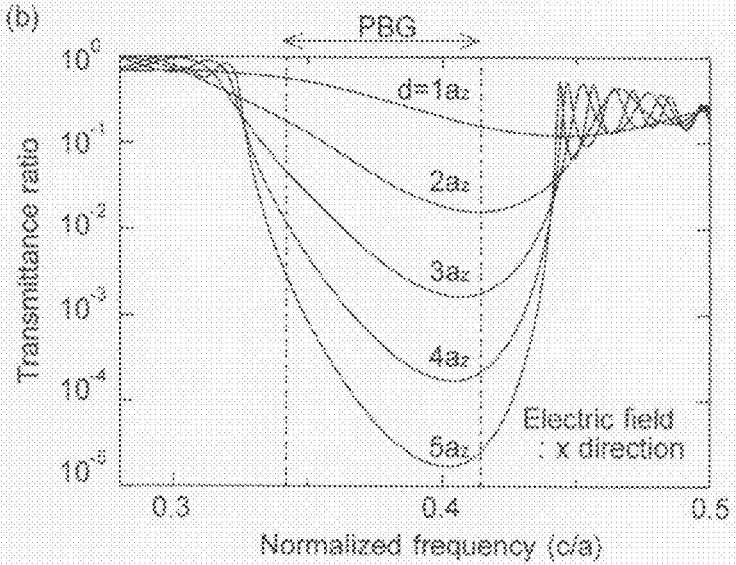
(b)
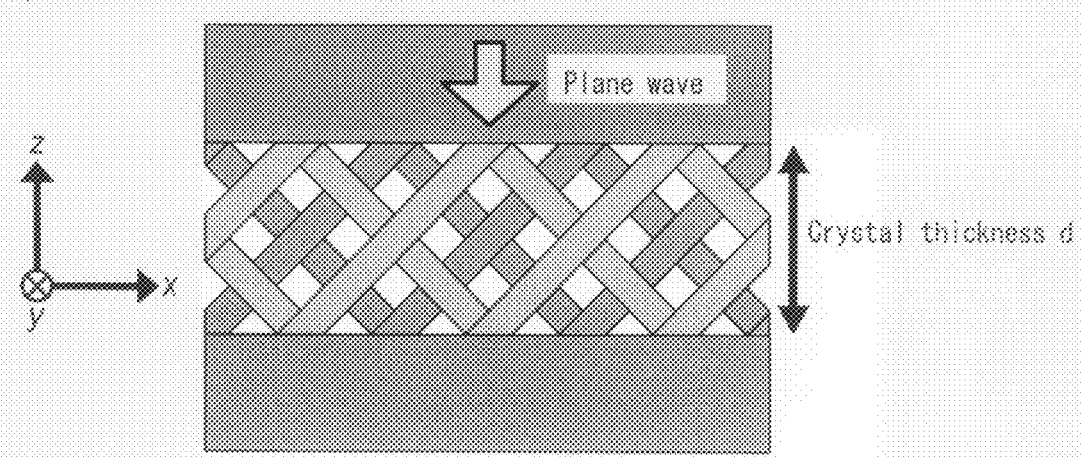
(c)

Fig. 17
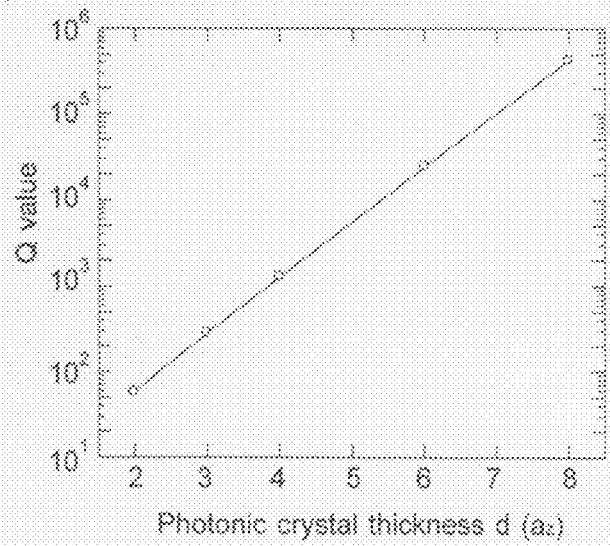
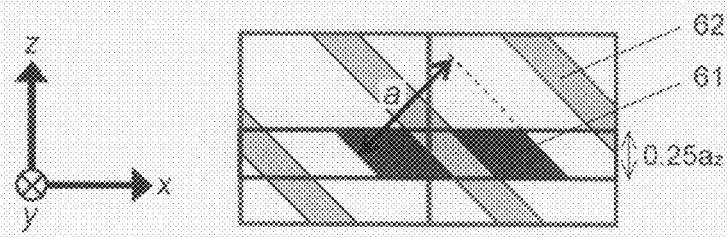
Fig. 18
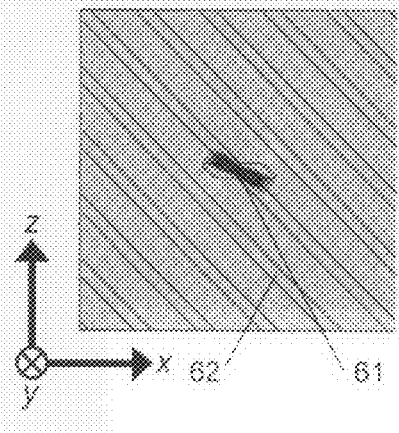
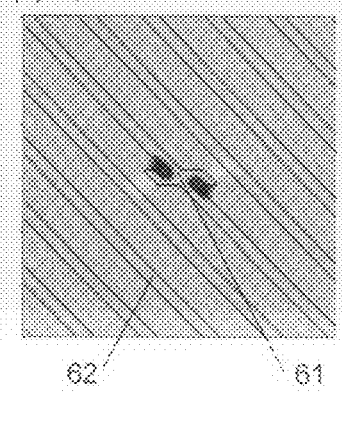
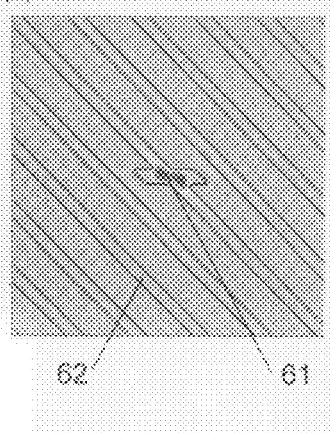

THREE-DIMENSIONAL PHOTONIC CRYSTAL AND ITS MANUFACTURING METHOD THEREOF

TECHNICAL FIELD

The present invention relates to a three-dimensional photonic crystal and a manufacturing method thereof to be applicable to optical resonators, optical waveguides, optical IC elements formed by combining therewith, and laser oscillators or the like using optical resonators.

BACKGROUND ART

Photonic crystals have been drawing attention as a new optical device in recent years. Photonic crystals are optical functional materials having a cyclic refractive index distribution, where a band structure is formed with respect to energy such as light and electromagnetic waves. Particularly characteristic features include formation of energy regions (i.e. photonic band gaps) where propagation of light and electromagnetic waves is impossible.

When refractive index distribution disturbances (or defects) are introduced into the refractive index distribution of photonic crystals, energy levels (or defect levels) caused by the defects are formed in photonic band gaps. Owing to that, light having a wavelength corresponding to energy of a defect level in a photonic band gap is exclusively allowed to exist in the position of the defect. Accordingly, optical circuit elements such as optical resonators composed of point-like defects and optical waveguides composed of linear defects can be provided in photonic crystals. A multiple number of these optical circuit elements are provided in one photonic crystal to compose an optical integrated circuit, where the photonic crystal is made to be an optical IC element. Discrete optical circuit elements are individually connected in the conventional technical field of optical communication or the like, whereas circuit microminiaturization can be realized by using the optical IC elements.

Photonic crystals include two-dimensional photonic crystals and three-dimensional photonic crystal. Three-dimensional photonic crystals have a merit of having little external leakage problem of light existing in defect positions in comparison with two-dimensional photonic crystals. Patent Document 1 describes a three-dimensional photonic crystal having a structure of a plurality of stacked stripe layers where rods made of materials having a higher refractive index than that of air are cyclically arranged in a parallel state from each other, and rods of the most adjacent stripe layers are orthogonal from each other, while rods of the next adjacent stripe layers are disposed in parallel and deviated by a half cycle. This document also describes formation of optical waveguides by providing linear defects in the rods to compose the three-dimensional photonic crystal.

Patent Document 1 further describes a method to manufacture this three-dimensional photonic crystal. The outline is as follows.

First, a planar material layer made of rod materials is formed on a substrate. A stripe structure is formed in this material layer by using photolithography and RIE (reactive ion etching). Two of the material layers attached to the substrates in the same stripe structure formation are superposed in the rod planes so that the rods are orthogonal from each other, followed by heating and fusing them. Thereafter, one of the substrates is removed to obtain a structure where two stripe layers are superposed on one substrate. Two sets of such structures are fabricated and superposed so that the rods in the stripe layers of the uppermost surfaces are orthogonal to each other and the rods in two of the stripe layers with a single layer inserted therebetween are arranged in parallel and deviated by a half cycle, where the uppermost stripe layers are fused by heating. Therefore, a structure with stacked four stripe layers can be obtained. Similar operation is repeated to obtain a three-dimensional photonic crystal composed of the stripe layers of 8 layers, 16 layers, and so on. This method is referred to as "fusion method" hereinafter.

Patent Document 2 describes a three-dimensional photonic crystal where point defects are provided in rods. The point defects include: a defect obtained by arranging a substance having a different shape, refractive index or the like in a partially removed region of a rod; a defect obtained by attaching a member to a rod without removing a part of a rod; a defect obtained by changing a shape of a rod itself (i.e. making it thicker/thinner); and the like. These point defects are made to be resonators which resonate with light of a certain frequency determined by the shape and size of the point defects and the position (or displacement) thereof with respect to the rods. The resonators can be component elements of an optical IC element as described above. Moreover, by introducing a light emitter to the defect portion, the point defect can be used as a laser light source where light is emitted by light resonance in the point defect.

Patent Document 1: Japanese Unexamined Patent Publication No. 2001-074955 ([0007], [0028] to [0035], FIG. 1 and FIG. 8)

Patent Document 2: Japanese Unexamined Patent Publication No. 2004-006567 ([0013] to [0015], FIG. 3 to FIG. 4)

DISCLOSURE OF THE INVENTION

Problem to be Solved by the Invention

Optical resonators and optical waveguides in the three-dimensional photonic crystal described in Patent Document 2 are formed by introducing the point defects and linear defects into the three-dimensional phonic crystal. However, the three-dimensional phonic crystals fabricated by the multilayered stripe layers according to the conventional fusion methods have restrictions on the shape and size of the defects. The size of the defects in the stacking direction is restricted by the thickness of the stripe layers (or rods). That is, the defect size in the stacking direction can be only selected by an integer multiple of the thickness of the stripe layers. It is also difficult to fabricate a defect structure across two of the stripe layers with a one layer thickness of the stripe layers, and there is problems of significant restriction on the shape of the defects.

Moreover, the fusion methods used for manufacturing three-dimensional photonic crystals require repetitive processes of fusing the stripe layers, and positions of the two structures need to be accurately adjusted in each one fusing processes, which require time and labor.

An object of the present invention is to provide a three-dimensional photonic crystal where point defects can be internally formed in an arbitrary shape and size without being restricted to the rod size and shape or the like. Another object of the present invention is to provide a method to easily manufacture the three-dimensional photonic crystal and a three-dimensional photonic crystal without having point defects.

Means for Solving the Problem

A three-dimensional photonic crystal achieved to solve the above problems according to the present invention is characterized by comprising:

a) a first crystal and a second crystal of three-dimensional photonic crystals wherein a base body of a dielectric substance containing multiple holes perforated obliquely to the surface of the base body from two different directions so as to form a two-dimensional cyclic pattern; and b) a connection crystal layer inserted between the first crystal and the second crystal, being a photonic crystal layer of a dielectric substance having a predetermined thickness, which partially mismatches the first crystal and the second crystal, and matches the first crystal and the second crystal in the remaining portion.

The aforementioned mismatch creates a defect or defects in the connection crystal layer in the three-dimensional photonic crystal. In this case, the phases of the refractive index distributions of the first crystal and the second crystal at the interfaces with the connection crystal layer allow adjustments in the shape of the holes and the base body portions between the holes of the connection crystal layer. Thus, adjustments in the shape of the base body enable to control the form of the defect or defects. The form of the defect or defects can also be controlled by the thickness of the connection crystal layer.

In describing characteristics common to the first crystal and the second crystal below, occasionally they are together referred to as a "main body crystal".

As for the connection crystal layer, that having the same crystal structure with the main body crystal at the matching portion may be employed. In this case, this layer is allowed to match the main body crystal.

If the connection crystal layer is thin, a connection crystal layer having a two-dimensional structure can be employed as the connection crystal layer. Such a connection crystal layer can be fabricated easier than connection crystal layers having the same crystal structure with the main body crystal.

The mismatching portions may be linearly continuous in a direction parallel to the connection crystal layer. These portions are made to be a linear defect, i.e. a waveguide.

The main body crystal can be preferably manufactured by a method characterized to have:

a first etching process where an anisotropic etching oriented to a first direction which obliquely intersects the surface of a base body of a dielectric substance is applied to the base body; and a second etching process where an anisotropic etching oriented to a second direction which differs from the first direction is applied to the base body.

The three-dimensional photonic crystal manufactured by this method is useful not only as the main body crystal according to the present invention but also as an independent three-dimensional photonic crystal by itself.

The manufacturing method of the three-dimensional photonic crystal of the first crystal, the second crystal and the connection crystal layer according to the present invention is characterized by having:

a process to manufacture the first crystal and the second crystal, and manufacture the connection crystal layer, being a photonic crystal layer of a dielectric substance having a predetermined thickness, which partially mismatches the first crystal and the second crystal and matches the first crystal and the second crystal in the remaining portion; and a process to join the first crystal to the connection crystal layer and the second crystal to the connection layer by adjusting positions on the basis of the match.

In the method to manufacture the main body crystal, the connection crystal layer can be manufactured by providing a mask on the surface of the base body where holes provided in the mask are partially made to have a form different from that of the remaining holes. Moreover, when a converged ion beam is used, it is possible to create holes in a part of the base body different from those of the other part, wherein the connection crystal layer can be manufactured by without using a mask.

If the connection crystal layer is thin, the layer may be manufactured by etching the base body unidirectionally. Therefore, manufacturing processes can be simplified. This unidirection may be a direction substantially vertical to the surface of the base body. Accordingly, usual etching of vertical directions can be employed to make it easy to manufacture the connection crystal layer.

BEST MODE FOR CARRYING OUT THE INVENTION

The three-dimensional photonic crystal according to the present invention has a structure of inserting a connection crystal layer between a first crystal and a second crystal which are three-dimensional photonic crystals, having a point defect or defects in the connection crystal layer. The structure will be explained below in detail.

In the main body crystal, a base body of a dielectric substance has multiple holes forming a two-dimensional cyclic pattern and perforated from a first direction, and further multiple holes forming a similar two-dimensional cyclic pattern and perforated from a second direction which differs from the first direction. What is meant by the "multiple holes forming the two-dimensional cyclic pattern" is that the multiple holes are arranged to form a cyclic pattern in a plane vertical to the respective perforation directions. Both of these two directions (i.e. first and second directions) need to intersect the surface of the base body obliquely. The two directions may be orthogonal or intersected obliquely. The two directions may also be or may not be a direction to realize a state that a plane including these directions is vertical to the surface of the base body.

The multiple holes having the two-dimensional cyclic pattern are thus perforated from the two different directions and thereby a three-dimensional cyclic pattern is formed in the inside of the base body. It is possible to consider a lattice structure corresponding to the three-dimensional cyclic pattern, wherein a lattice structure of holes (or spaces) as the lattice points is easier to consider if the base body portion predominantly occupies the three-dimensional photonic crystal thus formed. Meanwhile, if the hole portion (or space portion) predominantly occupies the three-dimensional photonic crystal, it is easier to consider a lattice structure of the base body portions (or dielectric substances) as the lattice points. In the following explanation, a lattice point made by a space is called a "space lattice point" and a lattice point made by a dielectric substance is called a "dielectric lattice point".

The three-dimensional photonic crystals described in Patent Document 1 and Patent Document 2 can be considered as a three-dimensional photonic crystal of dielectric lattice points, and used as the main body crystal of the present invention.

The connection crystal layer is formed to partially mismatch the main body crystal and match the main body crystal in the remaining portion. In the matching portion, the main body crystal and the connection crystal layer have continuous holes and base body, where a three-dimensional structure without having any defects through three structural portions including the first crystal, the connection crystal layer and the second crystal is formed to realize the three-dimensional photonic crystal with integrated three structural portions. On the contrary, the mismatching portion exhibits that the holes of the main body crystal and the connection crystal layer and the base body between the holes have different shapes which are made to be a defect or defects of the three-dimensional photonic crystal. An arbitrary size can be applied to the defect or defects by adjusting a thickness of the connection crystal layer. Although the conventional three-dimensional photonic crystals of a rod stacking form are allowed to change a defect size only by the unit of a rod thickness in a stacking direction, the three-dimensional photonic crystal according to the present invention is allowed to continuously change the defect size by the thickness of the connection crystal layer.

When such defect is arranged as a point, the defect is made to be a point defect, i.e. a resonator. When such defects are linked linearly in a direction parallel to the connection crystal layer, the defects are made to be a linear defect, i.e. waveguide. This waveguide obliquely intersects an extending direction of the holes.

The three-dimensional photonic crystal with the completely integrated main body crystal and connection crystal layer (excluding the mismatching portion) can be obtained by using the same materials in the connection crystal layer and the main body crystal.

If the point defect or defects are used as light emitting sources (or laser light sources), materials (i.e. light emitters) which differ from those of the main body crystal may be used.

As for the connection crystal layer, connection crystal layers having the same crystal structure with the main body crystal can be used in the matching portion. What is meant by the "same crystal structure" here is to have the holes extending in the two oblique directions in the same manner with the first and second crystals. A single three-dimensional photonic crystal is configured to completely match the first and second crystals in the matching portion and surround the mismatching portion. Such connection crystal layers are used to allow the matching portion to completely match the main body crystal.

As for the connection crystal layer, connection crystal layers having a two-dimensional structure can be used. What is meant by the "two-dimensional structure" is that cross sections parallel to the layer are not changed by cutting positions. It specifically means that the entire holes extend in the same direction. This direction can be, for example, the first direction, the second direction and a direction vertical to the layer plane or the like. Since connection crystal layers having this two-dimensional structure can be fabricated by a unidirectional etching, easy fabrication is realized. Since, moreover, the etching process can be a single process, deterioration of light emitters due to etching can be suppressed in fabricating the laser light sources.

When the connection crystal layer having the two-dimensional structure is used, hole connection between the main body crystal and the connection crystal layer is discontinuous in a strict sense. However, if the connection crystal layer is thin, the three-dimensional structure has a band gap, where it practically functions as a three-dimensional photonic crystal.

When the positions of holes of the first and second directions are adjusted in the plane where the main body crystal is connected to the connection crystal layer, the hole portion and the base body portion are alternately formed into a stripe pattern. Since the edge shape of holes is left on the border line of the stripe pattern, a zigzag shape or the like is exhibited there. In this case, the shape of the holes and base body of the corresponding connection crystal layer on the border lines of the matching portion may be formed into zigzag stripes so that it corresponds to the main body crystal. Alternatively, a rectilinear edge with a substantially equivalent stripe thickness is possible and it does not cause any problems in practice if the connection crystal layer is thin. In the latter case, it has an advantage of easily fabricating the connection crystal layer. Furthermore, if the stripes (i.e. hole portion and base body portion) is partially made to have a form different from that of the remaining stripes, the portion is turned into a linear defect, i.e. a waveguide.

In the three-dimensional photonic crystal according to the present invention, the form of the point defects in the connection crystal layer, including both the dielectric lattice points and the space lattice points, can be controlled with high versatility due to the following reasons.

Since the main body crystal is perforated obliquely to the surface from two different directions, the shape of the main body crystal in a cutting surface obtained by cutting the main body crystal in a plane parallel to the surface differs depending on the position of the cutting surface. Due to the cyclically formed holes, cyclic changes are observed in the shape of the cutting surface when the cutting surface is changed in a direction vertical to the surface. Accordingly, by adjusting the phase of the cyclic change at the interfaces between the main body crystal and the connection crystal layer, a structure of the connection crystal layer can be controlled. It is thus possible to control a structure of the connection crystal layer, so that a form thereof can be controlled with high versatility in introducing the point defects.

Since, moreover, the thickness of the connection crystal layer can be arbitrarily set, the form of the point defects can be controlled rather freely by adjusting the thickness.

Furthermore, the present invention allows various forms of the point defects in the direction of the connection crystal layer. Therefore, the point defects can be expanded even in a stacking direction of the stripe layers of the conventional three-dimensional photonic crystals. This direction is a direction where expansion of the point defects was difficult because fabrication of the stripe layers is restricted to stacking in the conventional fusion methods.

Moreover, many of the conventional point defects have a highly symmetrical shape such as a rectangular body, but the connection crystal layer in the three-dimensional photonic crystal according to the present invention is provided with the holes extending to a direction oblique to its surface for example, making it possible to easily introduce point defects having a cross section of distorted rectangle with two sides in parallel to the oblique direction and two sides in parallel to the connection crystal layer. In this point, parameters of the point defects, and thus parameters of resonators of the point defects, can be controlled with more versatility.

When light emitting material which emit light with an injection of electric current is used as the material of the connection crystal layer of the three-dimensional photonic crystal according to the present invention and current injecting electrodes are provided on both surfaces of the crystal, a light emitting device can be made. In this light emitting device, a voltage is applied to the electrodes so as to inject a current to a light emitting material through the main body material, so that the light emitting layer emits light. Resonance of emitted light in the point defect or defects enables to obtain laser oscillation. Light emission can be suppressed in the remaining portion by appropriately setting the photonic band gap. Since this light emitting device can be fabricated without using fusion processes as described later, failure in the current flow due to insufficient fusion is minimized and a high reliability is achieved.

When the holes extending from the mismatching portion of the connection crystal layer to the outside are made to have a form different from that of the remaining holes in the first crystal and the second crystal, a linear defect can be formed in these crystals. That is, the holes are made to be a waveguide.

Accordingly, it becomes extremely easy to introduce light from a surface of the main body crystal to the resonators and extract light from the resonators to the main body crystal. The linear defect may be arranged in contact with a point defect or defects, or may be displaced in a direction parallel to the connection crystal layer.

So far, explanation was made for three-dimensional photonic crystals which are formed by providing a single layer of the connection crystal layer between two layers of the main body crystal (i.e. first crystal and second crystal). Similarly, even if the main body crystal composed of three or more layers is integrated by inserting a connection crystal layer between adjacent main body crystal layers, point defects can be introduced in the same manner as described above. Such multilayered formation allows more versatile design of optical ICs or the like. When, for example, the mismatching portions in two of the connection crystal layers are arranged so as to be connected by the holes disposed along a single line, where the holes are made to have a form different from that of the remaining holes, a waveguide can be formed to send and receive light among the point defects provided in the two connection crystal layers. The point defects may be displaced from the waveguide in a direction parallel to the layers in the same manner as described above.

Explained next will be a method to manufacture a three-dimensional photonic crystal according to the present invention. First explained will be a method to manufacture the main body crystal, followed by explaining a method to manufacture a three-dimensional photonic crystal according to the present invention using the main body crystal fabricated by this method and the connection crystal layer fabricated by this method or another method. The main body crystal manufactured by a method to be described below is used not only as a component element of the three-dimensional photonic crystal (i.e. three-dimensional photonic crystal having the connection crystal layer) according to the present invention, but also as the three-dimensional photonic crystal by itself.

The method to manufacture the main body crystal is as follows. An anisotropic etching is applied from a surface of the base body of the dielectric substance to a first direction which obliquely intersects the surface in order to form multiple rod holes extending to the first direction (first etching process). At this time, the multiple holes are made to form a two-dimensional cyclic pattern in a plane vertical to the etching direction (i.e. first direction). The anisotropic etching is similarly applied to a second direction which obliquely intersects the base body surface in order to form multiple rod holes extending to the second direction (second etching process). The multiple holes here are also made to form a two-dimensional cyclic pattern in a plane vertical to the etching direction (i.e. second direction). The two-dimensional cyclic pattern of the first direction may be the same as or differ from the two-dimensional cyclic pattern of the second direction. The first direction is different from the second direction, and the two directions may be orthogonal or intersect obliquely. The multiple rod holes extending to the two different directions in the respective two-dimensional cyclic patterns thus provide a refractive index distribution having a three-dimensional cyclicity in the dielectric substance, so that the three-dimensional photonic crystal (main body crystal) is accomplished.

According to this method, the anisotropic etching is applied only twice to manufacture a three-dimensional photonic crystal, where the number of processes can be significantly reduced in comparison with the conventional methods associated with repetitive attacking and multiple fusion, so that it is not necessary to spend excessive time and labor for positional adjustments.

The anisotropic etching applied in the first etching process and the second etching process can be implemented by plasma etching, for example. That is, plasmatized gas is oriented to a predetermined direction by an electric field and made incident to an object to be treated, where the object to be treated is strongly etched to the direction physically and chemically. The two-dimensional cyclic patterns of the multiple holes in the first etching process and the second etching process can be formed by providing a corresponding mask having an angle corrected pattern on the surface of the base body.

As for the anisotropic etching, it is possible to employ ion beam etching, or further, reactive ion beam etching using reactive gas. In this case, it is not necessary to use a mask.

Both the first and second directions are preferably set at 45 degrees to the surface of the base body. In this case, the two directions are made to be orthogonal, and the first direction and the second direction can be switched only by rotating the base body 180 degrees on the axis vertical to the base body surface, so that the etching directions can be easily changed in the first etching process and the second etching process.

The linear defect in the three-dimensional photonic crystal (i.e. main body crystal) can be easily formed by making a part of the holes formed in the base body to have a form different from that of the remaining holes. The "form" of the holes includes the size and shape of the holes.

The connection crystal layer can be fabricated by a method similar to that of the main body crystal having the linear defect. That is, the connection crystal layer can be easily realized by setting the etching depth small in the manufacturing method of the three-dimensional photonic crystal having the linear defect. In a case of the connection crystal layer having a two-dimensional structure, easy fabrication is made possible by applying a single etching to a planar base body in a pattern including a point defect or defects. If the direction is a direction substantially vertical to the surface of the base body, normal etching of vertical direction can be employed, making it easier to manufacture the layer.

The three-dimensional photonic crystal according to the present invention is fabricated by joining the first crystal to the connection crystal layer and the second crystal to the connection crystal layer thus manufactured. At this time, the positional adjustments are made on the basis of the position of holes in the matching portions of the first crystal and the connection crystal layer, and the second crystal and the connection crystal layer. For this joint, heat fusion similar to that of manufacturing the conventional three-dimensional photonic crystals can be employed.

In this manufacturing method, it is sufficient to join two places in addition to etching, where the number of processes can be significantly reduced in comparison with the conventional methods which required a multiple number of fusing for stacking. Owing to such an easy fabrication method, a versatile defect structure can be introduced to the three-dimensional photonic crystal.

BRIEF DESCRIPTION OF THE DRAWINGS

FIG. 5 is a perspective view showing an example of the connection crystal layer 13 in the three-dimensional photonic crystal according to the present embodiment.

FIG. 6 is a view to explain a cross section of the three-dimensional photonic crystal according to the present embodiment.

FIG. 7 is a perspective view showing examples of point defects introduced to the connection crystal layer 13.

FIG. 8 is a perspective view showing examples of a linear defect introduced to the connection crystal layer 13.

FIG. 9 is a perspective view showing examples of the connection crystal layer 13 having a two-dimensional structure.

FIG. 16 is a graph showing results of calculating a transmittance ratio of the three-dimensional photonic crystal according to the present embodiment.

FIG. 17 is a graph showing results of calculating a Q value of a point defect 61 provided in the three-dimensional photonic crystal according to the present embodiment.

FIG. 18 is a view showing results of calculating a magnetic field distribution in the point defect 61.

EXPLANATION OF NUMERALS

Figure 1:
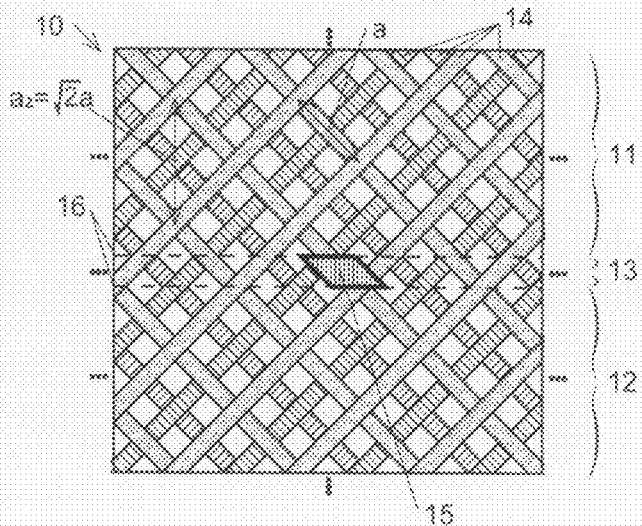
FIG. 1 is a longitudinal sectional perspective view showing a basic structure of an embodiment of a three-dimensional photonic crystal according to the present invention.

10 . . . Three-dimensional photonic crystal
11, 51 . . . First crystal
12, 52 . . . Second crystal
13, 131, 53 . . . Connection crystal layer
14, 42, 62 . . . Rod
15, 15a, 151, 56, 61 . . . Point defect
18, 181, 55 . . . Linear defect
19 . . . Member
20 . . . Conventional three-dimensional photonic crystal
21, 21a, 21b, 21c, 21d, 31a, 31b . . . Rod
22a . . . Stripe layer (first layer)
22b . . . Stripe layer (second layer)
22c . . . Stripe layer (third layer)
22d . . . Stripe layer (fourth layer)
23, 36a, 36b . . . Gap
25 . . . Stacking direction
31 . . . Base body
32 . . . First mask
33 . . . First mask hole
34 . . . Second mask
34a . . . First region
34b . . . Second region
34c . . . Third region
34d . . . Fourth region
35 . . . Second mask hole

EMBODIMENT

Explanation will be made for an embodiment of the three-dimensional photonic crystal according to the present invention by using FIG. 1 to FIG. 9.

FIG. 1 is a longitudinal cross sectional view (or perspective view) of a three-dimensional photonic crystal 10 according to the present invention. This three-dimensional photonic crystal 10 has a structure where a connection crystal layer 13 is held between a first crystal 11 and a second crystal 12. They are structured to combine rods 14 extending to two directions which are orthogonal from each other in a parallel cross pattern. A point defect 15 exists in the connection crystal layer 13. The point defect 15 will be described later.

Figure 2:
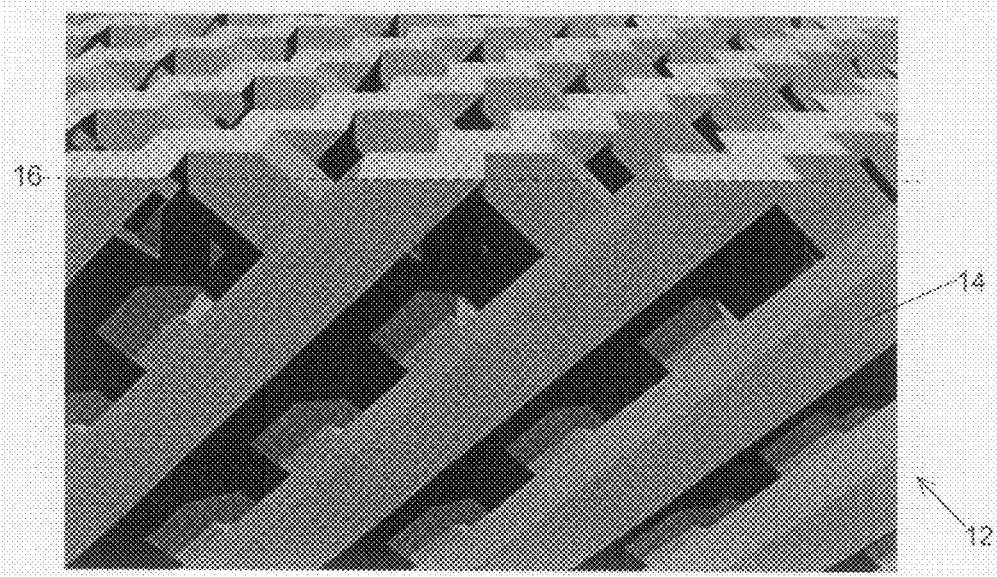
FIG. 2 is a perspective view showing a configuration of a second crystal in the three-dimensional photonic crystal according to the present embodiment.

FIG. 2 shows a perspective view of the second crystal 12 in order to explain the parallel cross structure. The first crystal 11 and the connection crystal layer 13 are structured basically in the same manner. The interface 16 is an interface to the connection crystal layer 13. The rods 14 extend in a direction oblique to the interface 16. This structure is the same as that of a conventional three-dimensional photonic crystal 20 shown in FIG. 3 except for the difference in the direction of the interface 16. In the conventional three-dimensional photonic crystal, rods 21 are arranged within one stripe layer in a substantially parallel state from each other with a cycle distance a (which will be referred to as an "in-plane cycle"), and such a stripe layer is repeatedly stacked with the first layer 22a to the fourth layer 22d, which will be described below, combined as one unit. A rod 21a of the 4n-th stripe layer (i.e. first layer) (n is an integer) 22a and a rod 21b of the (4n+1)-th stripe layer (i.e. third layer) 22b are substantially orthogonal. Moreover, the rod 21a and a rod 21c of the (4n+2)-th stripe layer (i.e. third layer) 22c are substantially parallel and displaced by a half a/2 of the cycle a. The relationship between the rod 21b and a rod 21d of the (4n+3)-th stripe layer (i.e. fourth layer) 22d is similar to the relationship between the rod 21a and the rod 21c. A gap 23 exists between the rods.

Figure 3:
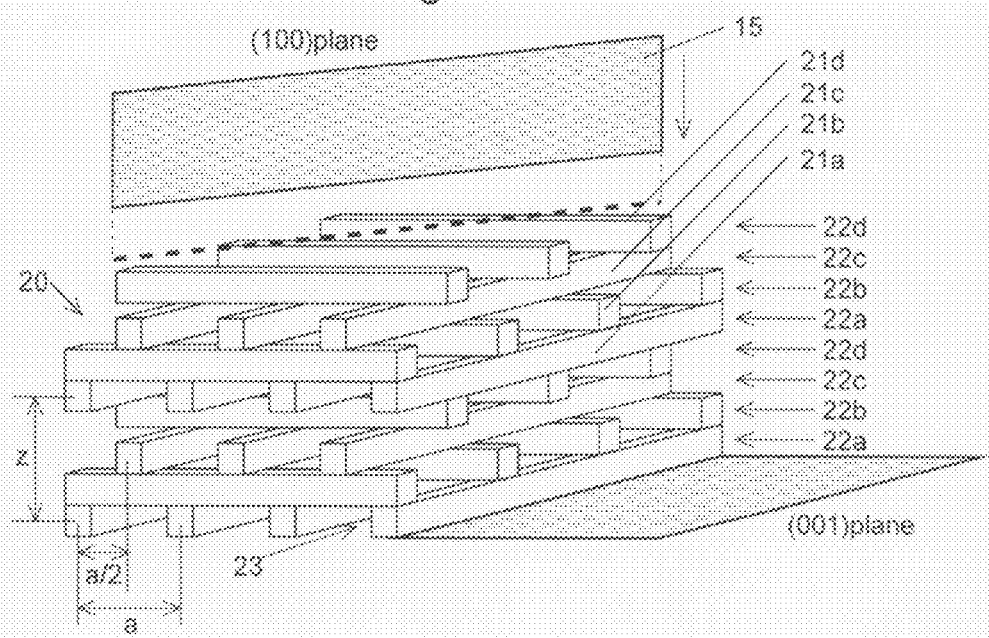
FIG. 3 is a perspective view showing a configuration of a conventional three-dimensional photonic crystal.

The crystal orientation of the three-dimensional photonic crystal in the present embodiment will be explained. Prior to the explanation, a crystal orientation in the three-dimensional photonic crystal is defined by a (100) plane and a (001) plane as shown in FIG. 3. A conventional three-dimensional photonic crystal 20 is fabricated by stacking and fusing the stripe layers 22a to 22d, where the surface of the crystal 20 is a plane (i.e. (001) plane) in a direction parallel to the stripe layers or the rods. On the contrary, in the first crystal 11 and the second crystal 12 of the three-dimensional photonic crystal 10 of the present embodiment, the interface 16 to the connection crystal layer 13 is a plane oblique to the rods. That is, the first crystal 11 and the second crystal 12 have a structure which is realized by cutting a conventional three-dimensional photonic crystal 20 in the plane. In the present embodiment, the interface 16 is made to be the (100) plane which is vertical to the (001) plane and intersects the entire rods at 45 degrees. Accordingly, if the three-dimensional photonic crystal 10 of FIG. 1 (i.e. present embodiment) is rotated by 45 degrees, a structure similar to that of the three-dimensional photonic crystal 20 of FIG. 3 is obtained except for the point defect 15.

Figure 4:
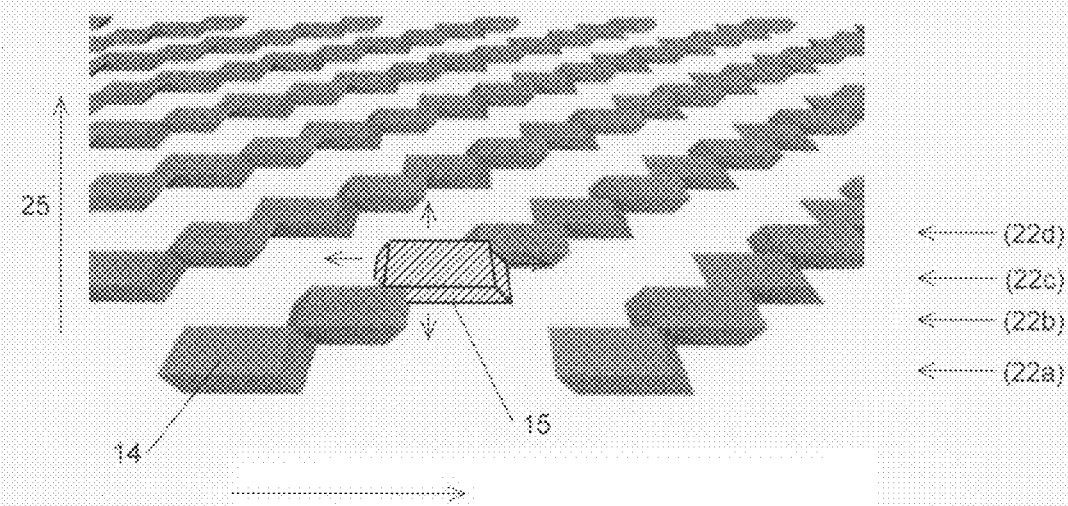
FIG. 4 is a perspective view showing an example of a connection crystal layer 13 in the three-dimensional photonic crystal according to the present embodiment.

FIG. 4 shows an example of the connection crystal layer 13. FIG. 4 is used to explain the point defect 15. The connection crystal layer 13 has a shape obtained by thinly cutting out the vicinity of the interface 16 in the three-dimensional photonic crystal 10 of FIG. 2 in parallel to the interface. One of the rods 14 is formed in such a manner that the shape of the other rods is expanded within the connection crystal layer 13. The rod makes a point defect 15. The point defect 15 can be expanded or reduced with versatility not only in a direction 24 parallel to the stripe layers 22a to 22d but also in a stacking direction 25, so that versatile setting can be realized in the shape of the point defect 15.

The shape of the connection crystal layer 13 can be controlled by the position of the interface 16 (i.e. the phase in the crystal cycle). FIG. 5 shows examples of the shape of the connection crystal layer 13. FIGS. 5a to 5e show the connection crystal layer 13 having a shape obtained by thinly cutting out the vicinity of cross sections A to E shown in FIG. 6 respectively. In the cross sections A to C, a multiple number of independent members 14a (i.e. members without having contact with other members) composed of two adjacent rods are formed. In the cross sections D and E, a member 14b composed of a single rod is linearly linked and thereby a stripe pattern is formed by the rod members and the gaps.

The shape of point defects can be controlled by the position of the interface 16. FIG. 7a shows a point defect 15a formed in the connection crystal layer 13 by thinly cutting out the vicinity of the cross section A, and FIG. 7b shows a point defect 15b formed in the connection crystal layer 13 by thinly cutting out the vicinity of the cross section E. The point defect 15a is formed by making one of the independent members 14a to have a form different (or expanded) from that of the other members. This point defect 15a is formed in a crossing point made by two of the rods 14. The point defect 15b is formed by making one of the linearly linked members 14b to have a form different (or expanded) from that of the other members. Such point defects was unable to form in a conventional three-dimensional photonic crystal 20 because they have a structure extending across a plurality of the stripe layers.

Similarly, the shape of linear defects can also be controlled by the position of the interface 16. In the cross sections A to C, the point defects to be formed as described above are linearly and continuously formed so as to form a linear defect. FIGS. 8a and 8b show examples of linear defects introduced to the cross section A. A plurality of the point defects 15a is linearly arranged to form linear defects 18a (FIG. 8a) and 18b (FIG. 8b). The extending direction of the linear defects can be controlled by the direction of arranging the point defects 15a. FIG. 8c shows an example of the linear defect introduced to the cross section E. One of the stripes of rod members is made to have a form different from that of the remaining stripes in order to form a linear defect 18c in the connection crystal layer 13. These linear defects, i.e. waveguides, extend in a direction oblique to the rods of the three-dimensional photonic crystal 10. It was impossible to realize such waveguides in conventional three-dimensional photonic crystals.

FIG. 9 shows examples of the connection crystal layer 13 having a two-dimensional structure. The connection crystal layer of a two-dimensional structure corresponding to the cross section A is shown in FIG. 9a, that corresponding to the cross section C is shown in FIG. 9b, and that corresponding to the cross section E is shown in FIG. 9c. In FIGS. 9b and 9c, one of the rod members is replaced with one rectangular body. In FIG. 9a, a rod member composed of two of the rods shown in FIG. 5a is replaced with one rectangular body. In either case, the structure closely approximates to that of FIGS. 4 and 5 when the layer is thin. Such connection crystal layers having a two-dimensional structure can be fabricated by a normal unidirectional etching. Furthermore, approximation to the structure of FIG. 9c can be realized by a linear member 19 extending to a direction of the linked rod members (i.e. stripe extending direction) (FIG. 9d).

Figure 10:
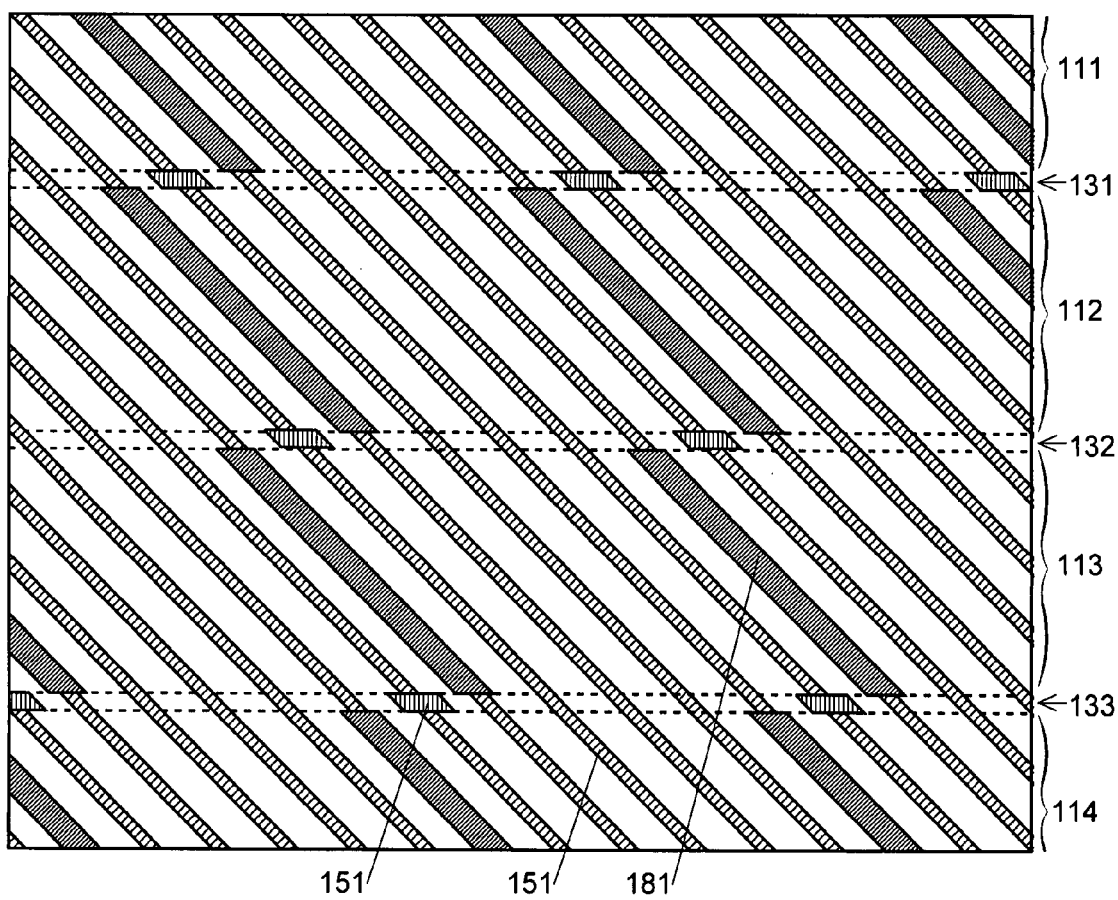
FIG. 10 is a longitudinal sectional view showing an example of a three-dimensional photonic crystal provided with a plurality of the connection crystal layers 13.
Figure 11:
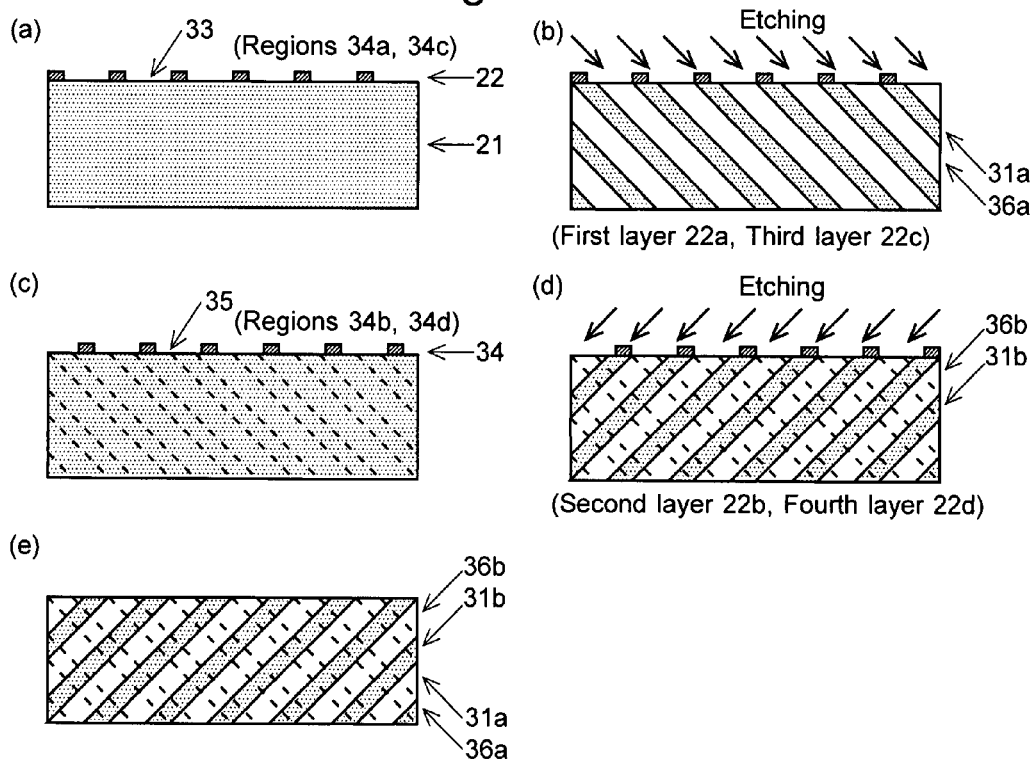
FIG. 11 is a cross sectional view showing an embodiment of a method to manufacture the three-dimensional photonic crystal according to the present invention.
Figure 12:
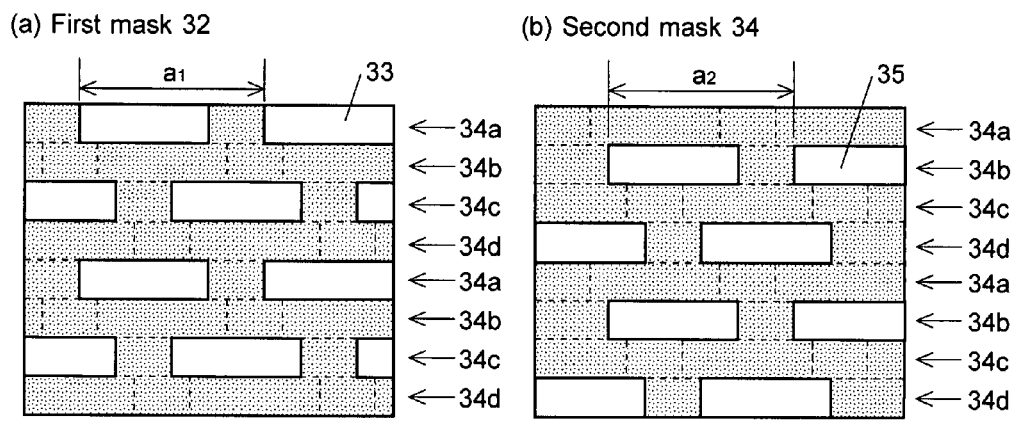
FIG. 12 is an upper surface view showing examples of a first mask and a second mask.
Figure 13:
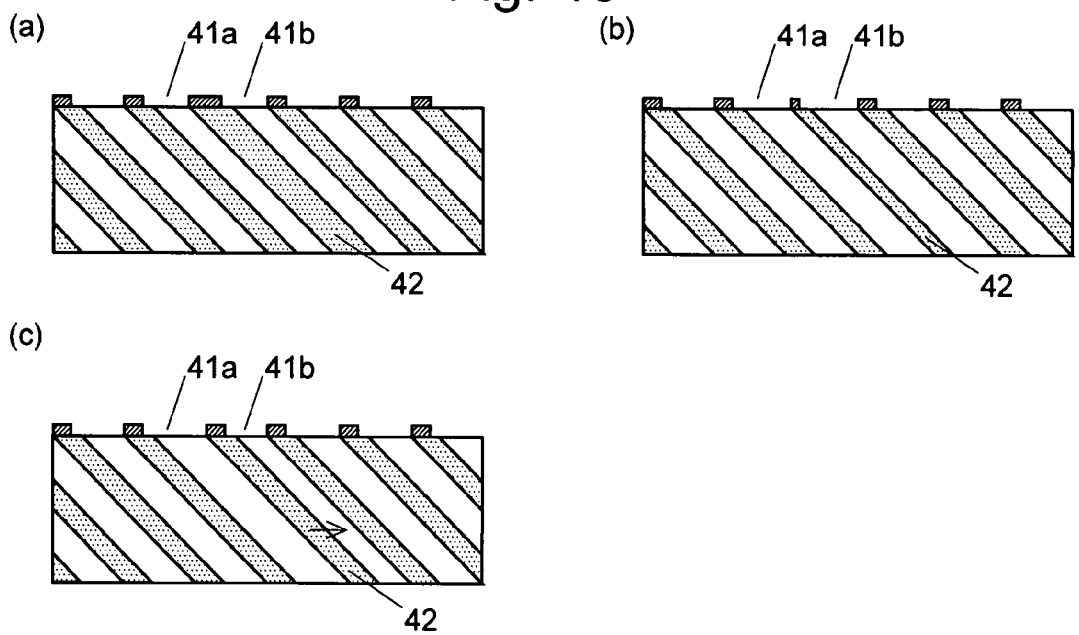
FIG. 13 is a cross sectional view showing an embodiment of a method to manufacture a three-dimensional photonic crystal having a linear defect.

FIG. 10 is a longitudinal sectional view showing an example of a three-dimensional photonic crystal provided with a plurality of connection crystal layers. Connection crystal layers 131, 132, . . . are inserted between a main body crystal 111 and a main body crystal 112, between the main body crystal 112 and a main body crystal 113, . . . . Furthermore, multiple point defects 151 are formed in each of the connection crystal layers 131, 132, . . . , and multiple linear defects 181 are formed in the main body crystals in the present embodiment. Each of the linear defects is arranged in the vicinity of the point defects. Arranging the point defects and the linear defects in such a manner, an interaction occurs between them, and an inflow/outflow of light becomes possible therebetween. As described above, the three-dimensional photonic crystal according to the present invention allows to arrange multiple point defects and multiple linear defects three-dimensionally, which enables producing optical integrated circuits.

Explanation will be made for an example of a method to manufacture the three-dimensional photonic crystal according to the present embodiment by using FIGS. 11 to 15.

Explained first will be an example of a method to manufacture the main body crystal. A first mask 32 is formed on a surface of a base body 31 made of the rod material, where the surface is divided into multiple band regions as shown in FIG. 12a. These band regions are divided into the 4n-th region (i.e. first region) 34a, (4n+1)-th region (i.e. second region) 34b, (4n+2)-th region (i.e. third region) 34c, and (4n+3)-th region (fourth region) 34d, where the four lines are made to be one repetition unit. The absolute position of the band regions is defined with respect to the surface of the base body 31. Multiple holes 33 are formed with a cycle distance $a_1$ in the first region 34a and the third region 34c on the first mask 32. The holes 33 of the third region 34c are positioned to be displaced from those of the first region 34a by $a_1/2$ in the longitudinal direction of the regions.

An anisotropic etching oriented to a predetermined first direction is applied to the base body 31 (FIG. 11a) coated with the first mask 32 having the multiple holes 33 from above the first mask 32 (FIG. 11b, first etching process). Therefore, the first layer 22a and the third layer 22c are formed. That is, multiple gaps 36a and 36c extending to the first direction are cyclically formed directly under the first region 34a and the third region 34c in the base body 31, where the dielectric base body left between the two adjacent gaps 36a (or 3c) is made to be a rod 31a (or 31c). Completion of the etching is followed by removing the first mask 32.

Next, a second mask 34 is formed on the surface of the base body 31 (FIG. 11c). FIG. 12b is a plan view showing an example of the second mask 34. Multiple holes 35 are formed in a cycle distance $a_2$ in the second region 34b and the fourth region 34d out of the first region 34a to the fourth region 34d defined to the surface of the base body 31 in a band state as described above. The holes 35 of the fourth region 34d are positioned to be displaced from those of the second region 34b by $a_2/2$ in the longitudinal direction of the regions.

An anisotropic etching oriented to a second direction which is substantially orthogonal to the first direction is applied to the base body 31 coated with the second mask 34 from above the second mask 34 (FIG. 11d, second etching process). Therefore, the second layer 22b and the fourth layer 22d are formed. That is, multiple gaps 36b and 36d extending to the second direction are cyclically formed directly under the second region 34b and the fourth region 34d in the base body 31, where the dielectric base body left between the two adjacent gaps 36a (or 36c) is made to be a rod 31a (or 31c). Since the first direction and the second direction are made to be substantially orthogonal, the rods (i.e. rod 31a and rod 31b or the like) fabricated directly under the adjacent regions are substantially orthogonal. Completion of the etching is followed by removing the second mask 34. Accordingly, the main body crystal as shown in FIG. 2 where the gaps are formed obliquely to the surface of the base body 31 is accomplished (FIG. 11e).

If a convergence ion beam method is used for the anisotropic etching, a convergence ion beam is irradiated on the surface of the base body 31 in accordance with a form of the created gaps without covering the surface of the base body 31 with the masks as described above, so that the same three-dimensional photonic crystal (i.e. main body crystal) as described above can be manufactured.

The first and second directions are preferably set at 45 degrees to the surface of the base body. In this case, the two directions are orthogonal, and the first direction and the second direction can be switched only by rotating the base body 31 180 degrees on the axis vertical to the mask plane, realizing an easy change in the etching direction between the first and second etching processes. In this case, by making the cycle $a_1$ and the cycle $a_2$ equal (i.e. $2^{0.5}a$), rods can be formed in the predetermined in-plane cycle a. Moreover, the size of the mask holes should be equal to $2^{0.5}(a-W)$ in the longitudinal direction of the band regions, and equal to the width of the band regions in the width direction (W is the width of the rods in the longitudinal direction).

In the above-described manufacturing method of the main body crystal (herein referred to as the first method), by making a part of the holes 33 and 35 provided in the first and second masks to have a form different from that of the remaining holes, a linear defect can be introduced to the three-dimensional photonic crystal (which will be referred to as the second method). For example, in the aforementioned examples, by making the holes 41a and 41b of the masks in contact with an object rod 42 smaller than the remaining holes, the width of the rod 42 can be enlarged (FIG. 13a). On the contrary, by making the holes 41a and 41b larger than the remaining holes, the width of the rod 42 can be decreased (FIG. 13b). Further, one of the hole 41a and the hole 41b may be made larger and the other may be made smaller so as to displace the rod 42 from the cyclic arrangement (FIG. 13c). The shape of a hole may be made different from that (i.e. rectangle) of the remaining holes, circular or wedge-shaped for example, whereby the rod in contact with the hole may be shaped differently from the remaining rods.

Figure 14:
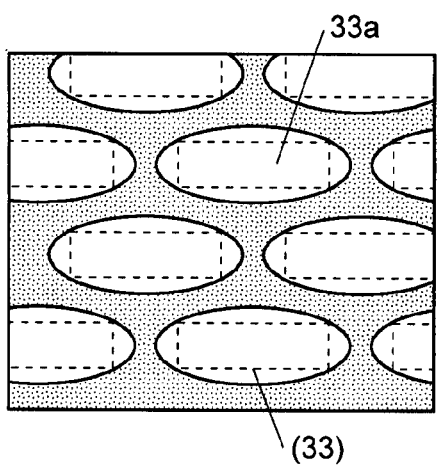
FIG. 14 is an upper surface view showing other examples of the first mask and the second mask.
Figure 15:
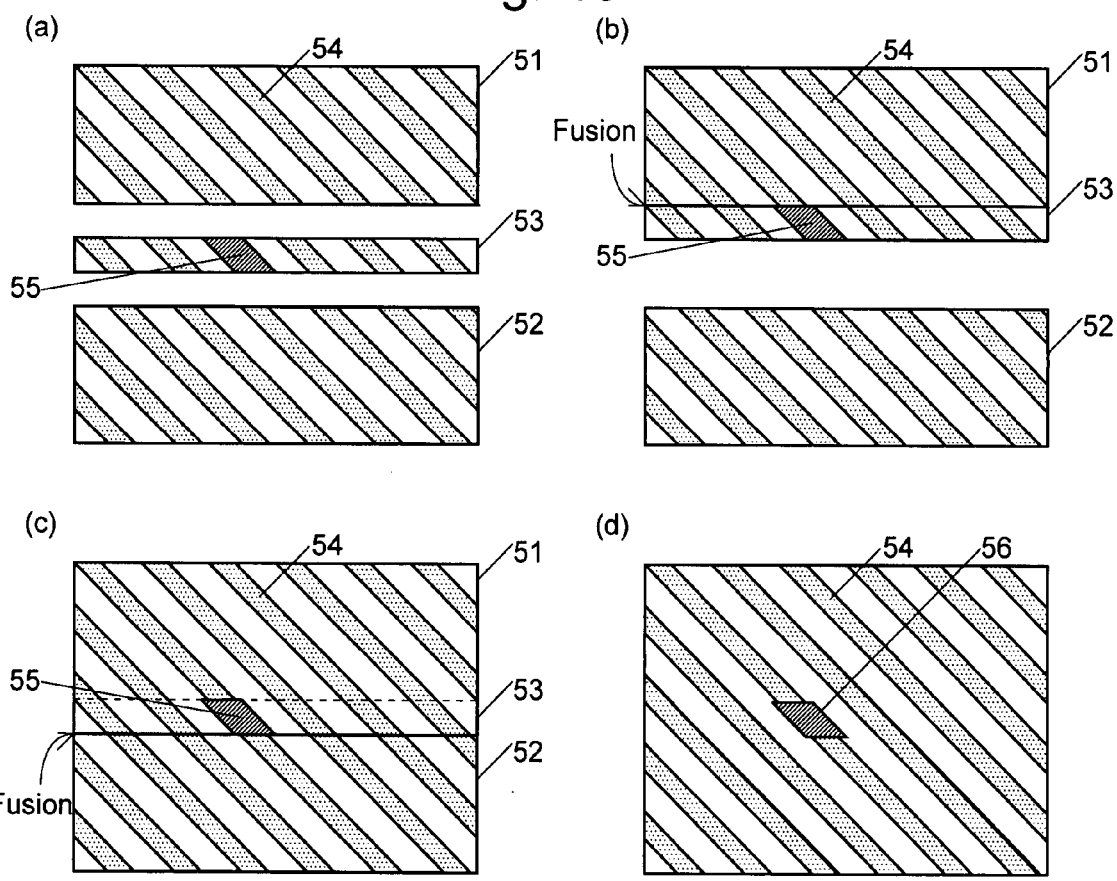
FIG. 15 is a cross sectional view showing an embodiment of a method to manufacture a three-dimensional photonic crystal having a point defect.

The methods according to the present invention enable to manufacture not only a three-dimensional photonic crystal having a structure of stacked rods (i.e. stripe layers) (i.e. stacked structure) in the final stage as described above, but also the three-dimensional photonic crystal having a structure of perforating (i.e. perforation structure) multiple holes cyclically in the block from two directions. For example, a first mask (shown in FIG. 14) and a second mask (not shown) having cyclically formed elliptical holes 33a are used to perform etching, so that a three-dimensional photonic crystal with cyclically formed gaps having elliptical cross sections can be manufactured. Here, broken lines in FIG. 14 indicate positions of the mask holes 33 shown in FIG. 12. If the convergence ion beam is used to perform etching, a similar three-dimensional photonic crystal can be manufactured without using the masks as shown in FIG. 14. In the case of manufacturing a three-dimensional photonic crystal of the perforation structure, some of the holes are shaped differently from the other holes to allow introduction of a linear defect therein.

Explained next will be an example of a method to manufacture the three-dimensional photonic crystal in the aforementioned embodiment composed of the main body crystal and the connection crystal layer.

First, two three-dimensional photonic crystals without point defects (i.e. first crystal 51 and second crystal 52) are manufactured according to the aforementioned first method (FIG. 15a). Alternatively, a three-dimensional photonic crystal with a linear defect 55 (i.e. connection crystal layer 53) is manufactured according to the aforementioned second method (FIG. 15a). When the thickness of the connection crystal layer 53 is small, the linear defect 55 becomes a point defect 56 in a finally manufactured three-dimensional photonic crystal.

Cutting surfaces of the first crystal 51 and the connection crystal layer 53 are fitted by adjusting the position so that their rods are connected in portions except for the point defect 56 (FIG. 15b). Positional adjustments of the rods here can be realized by positional adjustment methods used in the conventional fusion methods. By heating them in this state, the first crystal 51 and the connection crystal layer 53 are fused. Next, the cutting surface on the other side of the connection crystal layer 53 is fitted to the cutting surface of the second crystal 52 by adjusting the position so that their rods are connected in portions except for the point defect 56, and they are heated for fusing (FIG. 15c). Thus a three-dimensional photonic crystal containing the point defect 56 in the connection crystal layer 53 (FIG. 15d) is obtained.

Described next is the results of calculating transmittance characteristics of the three-dimensional photonic crystal of the present embodiment by using a three-dimensional FDTD method.

First, the results of calculating characteristics of the main body crystal is described. The (100) plane which intersects the entire rods at 45 degrees is assumed to be an interface, and when a plane wave traveling from the interface to the direction vertical to the interface (referred to as a z direction) is made incident, a transmittance ratio of the plane wave is calculated using the crystal thickness d as a parameter. The calculation results are shown in FIGS. 16a and 16b. A normalized frequency which is set to be dimensionless by multiplying a frequency by a/c (c is the light speed) is used in the abscissa of FIGS. 16a and 16b. Calculations were made here for the crystal thickness d of $1 \cdot a_z$ to $5 \cdot a_z$ ($a_z=2^{0.5}a$, refer to FIGS. 1 and 16c). The transmittance in the photonic band gap (PGB) exhibits value of as low as several % for the polarization direction of both y direction (FIG. 16a) and x direction (FIG. 16b) when the crystal thickness d is about $2 \cdot a_z$. Furthermore, the transmittance ratio is decreased by about one digit in every increase of 1 $a_z$ in the thickness. That is, characteristics of the three-dimensional photonic crystal can be sufficiently exhibited by setting a thickness of the main body crystal to 2 $a_z$ to 3 $a_z$ or larger.

Described next is the results of calculating characteristics of the connection crystal layer. FIG. 17a shows the results of calculating the Q value of a point defect 61 (FIG. 17b) having a height a between two planes parallel to the rod 62. The thicknesses of the first and second crystals are made to be $2 \cdot a_z$ or larger to make the Q value of the point defect 61 1000 or larger, which is required by laser oscillation at room temperatures. When the condition that the thickness of the main body crystal is $2 \cdot a_z$ or larger was assumed, it was revealed that $2 \cdot a_z$ is 1.70 μm and the length of the hole between the rods is $4 \cdot a$, i.e. 2.4 μm when the interval a between the rods 62 is 0.6 μm (thereby a photonic band gap is formed for the light of 1.55 μm band). Holes with such lengths can be fabricated according to the current anisotropic etching techniques.

Moreover, FIG. 18 shows the results of calculating an electromagnetic field distribution in the periphery of the point defect 61. A magnetic field is strongly confined in any directions of x, y and z, indicating usability of the point defect 61 as an optical resonator.

The invention claimed is:

1. A three-dimensional photonic crystal, comprising:
   a) a first three-dimensional photonic crystal and a second three-dimensional photonic crystal, in which a dielectric base body of each of the first three-dimensional photonic crystal and the second three-dimensional photonic crystal contains multiple holes fabricated obliquely to a surface of the base body from two different directions so as to form a two-dimensional cyclic pattern; and
   b) a connection crystal layer inserted between the first three-dimensional photonic crystal and the second three-dimensional photonic crystal, the connection crystal layer being a photonic crystal layer of a dielectric substance having a predetermined thickness, which partially mismatches the first three-dimensional photonic crystal and the second three-dimensional photonic crystal and matches the first three-dimensional photonic crystal and the second three-dimensional photonic crystal in the remaining portion.

2. The three-dimensional photonic crystal according to claim 1, wherein the connection crystal layer has the same crystal structure with the first three-dimensional photonic crystal and the second three-dimensional photonic crystal in the matching portion.

3. The three-dimensional photonic crystal according to claim 1, wherein the connection crystal layer has a two-dimensional structure.

4. The three-dimensional photonic crystal according to claim 1, wherein a stripe pattern made by alternately existing base body portions and hole portions is formed in joint planes of the first three-dimensional photonic crystal and the second three-dimensional photonic crystal to the connection crystal layer.

5. The three-dimensional photonic crystal according to claim 1, wherein the mismatching portions are linearly connected in a direction parallel to the connection crystal layer.

6. The three-dimensional photonic crystal according to claim 1, wherein the connection crystal layer is made of a light emitting material and provided with electrodes to inject currents to the light emitting material on both surfaces thereof.

7. The three-dimensional photonic crystal according to claim 1, wherein the holes extending from the vicinity of the mismatching portion of the connection crystal layer to the outside are partially different from the remaining holes in the first three-dimensional photonic crystal and the second three-dimensional photonic crystal.

8. The three-dimensional photonic crystal according to claim 1, wherein connection crystal layers are inserted between adjacent layers of three or more layers of main body crystal similar to the first three-dimensional photonic crystal and the second three-dimensional photonic crystal.

9. The three-dimensional photonic crystal according to claim 8, wherein holes to connect the mismatching portions of the two connection crystal layers in the main body crystal between the two connection crystal layers are different form the remaining holes.

10. The three-dimensional photonic crystal according to claim 1, wherein the first three-dimensional photonic crystal and the second three-dimensional photonic crystal are formed with:
    multiple holes extending to a first direction in a cycle a1 from a 4n-th (n is an integer) region out of a plurality of band regions obtained by dividing the surface of the base body;
    multiple holes extending in a cycle a2 from a (4n+1)-th region to a second direction being different from the first direction;
    multiple holes extending in the cycle a1 from a (4n+2)-th region to the first direction in a position deviated from the holes of the 4n-th region by a1/2 in a longitudinal direction of the bands; and
    multiple holes extending in the cycle a2 from a (4n+3)-th region to the second direction in a position deviated from the holes of the (4n+1)-th region by a2/2 in the longitudinal direction of the bands.

11. The three-dimensional photonic crystal according to claim 10, wherein the base body with the perforated holes has a stacked rod shape and the first direction is substantially orthogonal to the second direction.

* * * * *